United States Patent
Langenbacher

(10) Patent No.: US 6,191,714 B1
(45) Date of Patent: Feb. 20, 2001

(54) A/D CONVERTER CORRECTION SCHEME

(75) Inventor: Harry Langenbacher, Pasadena, CA (US)

(73) Assignee: Photobit Corporation, Pasadena, CA (US)

( * ) Notice: Under 35 U.S.C. 154(b), the term of this patent shall be extended for 0 days.

(21) Appl. No.: 09/191,201

(22) Filed: Nov. 12, 1998

Related U.S. Application Data
(60) Provisional application No. 60/065,126, filed on Nov. 12, 1997.

(51) Int. Cl.[7] .................................................. H03M 1/06
(52) U.S. Cl. ............................................................... 341/118
(58) Field of Search ...................................... 341/118, 120

(56) References Cited

U.S. PATENT DOCUMENTS

| | | | | |
|---|---|---|---|---|
| 4,399,426 | * | 8/1983 | Tan ........................................ | 340/347 |
| 4,673,917 | * | 6/1987 | Urschel et al. ....................... | 340/347 |
| 4,736,189 | * | 4/1988 | Katsumata et al. .................. | 340/347 |
| 4,903,023 | * | 2/1990 | Evans et al. .......................... | 341/120 |
| 4,947,168 | * | 8/1990 | Myers ................................... | 341/120 |
| 5,204,761 | * | 4/1993 | Gusmano .............................. | 358/461 |
| 5,793,319 | * | 8/1998 | Ard ....................................... | 341/120 |
| 5,977,894 | * | 11/1999 | McCarroll et al. ................... | 341/120 |

\* cited by examiner

*Primary Examiner*—Brian Young
(74) *Attorney, Agent, or Firm*—Fish & Richardson P.C.

(57) ABSTRACT

Differential nonlinearity is corrected by a look up table. The look up table obtains one extra bit of information and uses it to address corrected information in the look up table. The corrected look up table information represents information that is corrected for a differential nonlinearity error.

20 Claims, 2 Drawing Sheets

A/D CONVERTER CORRECTION SCHEME

CROSS REFERENCE TO RELATED APPLICATIONS

This application claims the benefit of the U.S. Provisional Application No. 60/065,126, filed on Nov. 12, 1997, which is incorporated herein by reference.

BACKGROUND

Many A/D converters suffer from a differential non-linearity error. This error may be caused by inaccuracy in capacitor sizing. This inaccuracy often causes missing codes in the output of the A/D converter. This results in granularity in the A/D converter and effectively reduces a dynamic range of the A/D converter output.

These missed codes often occur at the transition between most significant bits. For example, an incremental voltage beyond the voltage yielding the code 0111111 yields a code 1000011. This means that the codes between 0111111 and 1000011 are never used.

SUMMARY

The present system describes a highly linear N bit A/D converter system formed of an N+1 bit A/D converter and a memory. The A/D converter is purposely designed to miss codes, rather than repeat codes, when the most significant bits are turned off. The N+1 bits of output of the A/D converter is used to address a calibrated value in a look-up table in a memory that has N+1 address bits and N bits per word.

BRIEF DESCRIPTION OF THE DRAWINGS

These and other aspects of the invention will now be described with reference to the attached drawings, in which.

DESCRIPTION OF THE PREFERRED EMBODIMENTS

Figure 1:
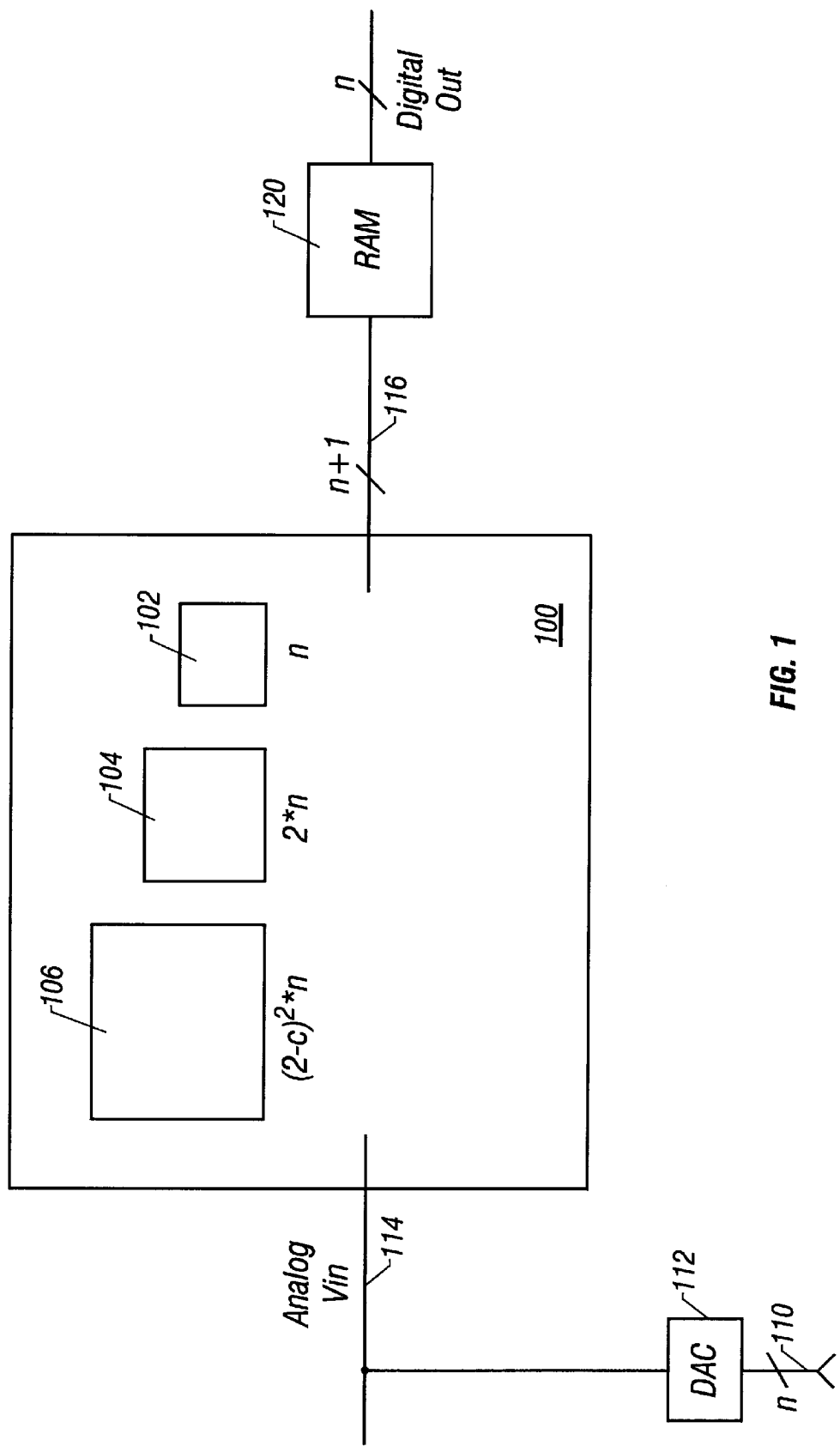
FIG. 1 shows a basic block diagram of the preferred A to D converter system.

The basic embodiment is shown in FIG. 1. The A/D converter system is shown connected in a test mode.

The A/D converter device 100 includes a plurality of capacitors. Those capacitors are used for converting the voltages. The preferred mode uses a successive approximation A to D converter. Three capacitors 102, 104, and 106 are shown, which are used as auxiliary circuits for the A to D converter. In a conventional A/D converter of this type, each capacitor has double the area of the preceding capacitor, and hence double the capacitance. The A/D converter 100 of the preferred embodiment has each capacitor sized less than or equal to two times the capacitance of the next smaller one. For example, a target of $1.95 \cdot C_{n-1}$, is preferred, except at the lowest significant bit where a target ratio of 2 is probably best. Hence, capacitor 104 is 2-N in size relative to the smallest capacitor 102 of size n. However, capacitor 106 is, more generally, $(2-\text{correction}) \cdot 2^N \cdot n$, where correction is the correction value, N is the bit number−1, and n is the value of the smallest capacitor.

In the test mode, an input word 110 is converted by D/A converter 112 to produce the analog voltage input 114. The A/D converter output 116 produces an N+1 bit output.

Taking a number of representative output codes, the input to output relationship will tend to look like the following:

| Input Voltage | ADC Output |
|---|---|
| 100100 | 100100 |
| 100011 | 100100 |
| 100010 | 100011 |
| 100001 | 100010 |
| 100000 | 100001 |
| 011111 | 100000 |
| 011110 | 011100 |
| 011101 | 011011 |
| 011100 | 011010 |
| 011011 | 011001 |
| 011010 | 011001 |

As the input voltage ramps down towards the point where the most significant bit will begin to drop out, the new few codes will be those that are missed. This is often caused by sum of the capacitances on the lesser bits being greater than the capacitances of the most significant bits.

The inventor found that by sacrificing one bit of resolution, the most nearly correct digital value can be written in the RAM location addressed by the raw A/D converter output as shown.

| Address (uncorrected digital value) | Output (corrected digital value) |
|---|---|
| 100100 | 10010 |
| 100011 | 10001 |
| 100010 | 10001 |
| 100001 | 10001 |
| 100000 | 10000 |
| 011111* | x |
| 011110* | x |
| 011101* | x |
| 011100 | 01111 |
| 011011 | 01110 |
| 011010 | 01110 |
| 011001 | 01101 |

The values indicated with "*" represent missing codes which have been found by the test setup not to occur. These values need not be stored into the look up table, thereby reducing the amount of needed look up table storage.

An alternative, but less preferred embodiment, fills in those values just in case they do occur. They can be filled in with the most likely values that the codes would represent if they accidentally did occur.

Look-up table memory 120 carries out the lookup conversion. Ram 120 is addressed by the n+1 bits of uncorrected digital output on 116, and produces a corrected N bit digital output.

Figure 2:
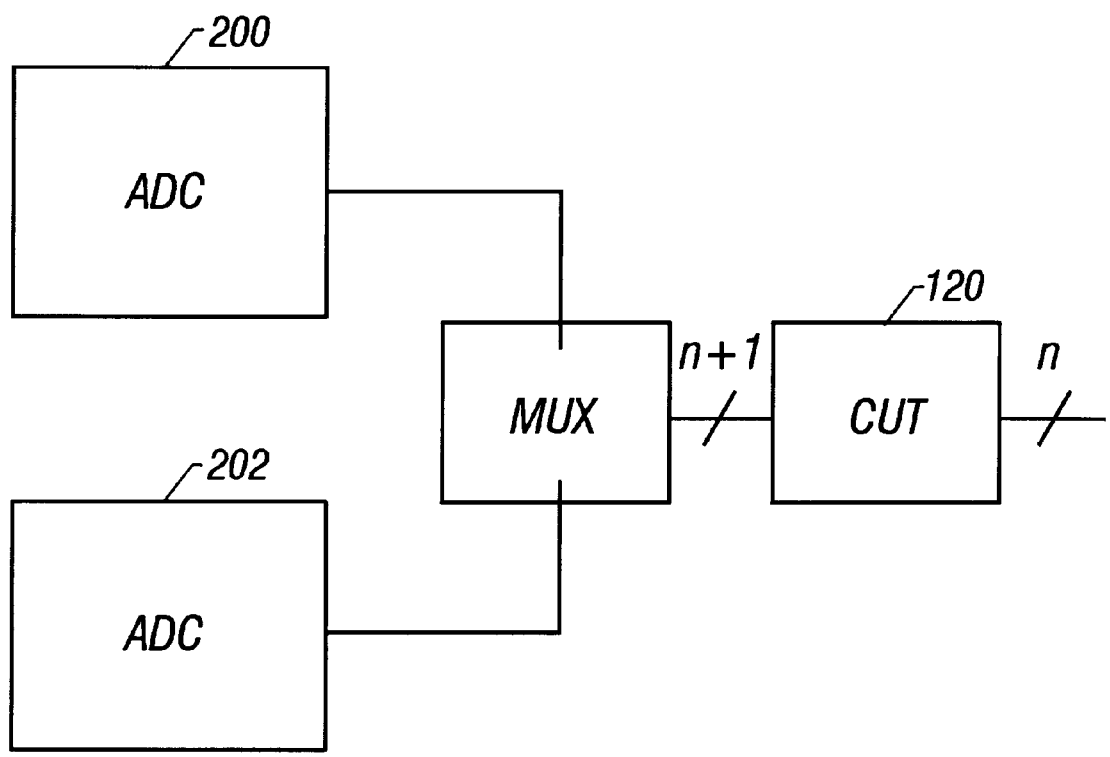
FIG. 2 shows a system with two A to D converters using a single look up table.

FIG. 2 shows another embodiment, with multiple A/D converters 200, 202. These A/D converters have consistent characteristics. The two outputs are connected to a multiplexer, to a single look-up table ram 120. Preferably, these are all on a common substrate.

Another embodiment uses the look-up table memory 120 to also correct for fixed pattern noise in a pixel device.

The set of missing codes should ideally depend on the ratio of capacitances, and these ratios should be the same in identically-constructed cells on the same chip.

The inventor has written a program (in the C language) to simulate the response of such a response in an A/D converter and to show how this system is used. This program is also used to calculate the contents of the correction ram with the sizing of the capacitances as a variable. The program shows that the ratio of capacitances can be as low as 1.78 while still allowing enough unique codes out of a 9-bit A/D converter to be corrected to 8-bits with plus and minus M least significant bit accuracy even in view of 217 "missing codes".

This simulation program shows that the minimum total capacitance needed in a 9-bit ADC to get resolution correctable to 8-bits is the same as in an ideal 8-bit DAC. Using capacitor ratios of 2, 1.78, 1.78, 1.78, 1.78, 1.78, 1.78, 1.78, a 9-bit ADC has total capacitance=1+2.0+3.5+6.3+11.2+20.0+35.6+63.3+112.7=255.6 in units of the smallest capacitor, while the total capacitance for an 8-bit ADC with a ratio of 2.0 is 1+2+4+8 . . .+128=255 in the same units, so there would tend to be a savings in capacitor area to help offset the increased area needed for the ninth bit.

Further layout space might be saved since it will not be necessary to lay out the capacitors so carefully—the capacitors can be bent, composed of separate pieces, and have dissimilar construction from bit to bit, as long as the capacitance ratio from bit to bit is at least about 1.8.

This technique will also correct for differences in the ratio of the perimeter capacitance (per length) to the plate capacitance (per area) should it vary from run to run, wafer to wafer, chip to chip (but not ADC to ADC), as well as other process variations affecting the linearity of the ADC.

An on-board DAC with supporting logic could be used to perform the calibration using a reasonably simple algorithm. The DAC would be set to provide a range of output that is within the input range of the ADC, such that the ADC will generate a sufficient number of unique output codes to map the entire output range.

A simplistic correction algorithm would be to use a DAC with a number of bits equal to the number of bits desired as output of the look-up table. The ADC would be set to give an (uncorrected) ADC output value of 0 at the low end, and all 1's at the high end.

Set DAC to zero loop:

```
{       read ADC output
        write the DAC value into the RAM location
        addressed by the ADC output value. Fill in
        any missing codes between this location and
        the last location addressed with the same DAC
        value.
        Increment the DAC value and exit the loop if
        it rolls over back to zero.
}
``` now for any given input voltage in the range of the DAC, the output of the Ram will be correct within one count.

This algorithm should be refined, as attempted in the C program, to use more DAC bits, do averaging, rounding, handling of boundary conditions, etc. Other calibrations schemes might be used.

The same sort of reasoning can be used to correct a DAC with repeated (extra) output values (i.e., where the bit weight ratios are <2) by mapping an N-bit input value of the DAC to an N+1 bit value to be fed to the non-linear/non-monotonic N+1-bit DAC. The value written into each address should simply be whatever N+1-bit value it is that produces the desired output voltage from the DAC with the least error. Again, a calibration must be performed, but one correction look-up table should suffice for all identically constructed DAC's on the chip.

An output of the ADC simulation programs follows. This calculates what the threshold voltage would be for each ADC code, and then chooses the N−1 bit output code that would represent a voltage closest to the actual threshold voltage. Note that there are no missing output codes (0–255 are all there), in spite of 45 missing codes when the MSB goes to zero on the input to the table.

The missing ADC codes are filled in with the value that they would represent according to the sum of their capacitances. In a self-calibration scheme, these codes should be unobservable and would probably best be filled in with the value from the nearest non-missing code.

ratio = 1.900
ADCBITS = 9 OUTBITS = 8
total capacitance = 1 + 2.0 + 3.8 + 7.2 + 13.6 + 25.9 + 49.3 + 93.6 + 177.9 = 374.3 in units of the smallest capacitor
outputvoltagestep = 0.0039
LOOKUP TABLE

| INPUT | OUTPUT | actual voltage | reported voltage |
|---|---|---|---|
| 111111110 | 11111110 | 0.997 | 0.996 |
| 111111101 | 11111110 | 0.995 | 0.996 |
| 111111100 | 11111101 | 0.992 | 0.992 |
| 111111011 | 11111100 | 0.990 | 0.988 |
| 111111010 | 11111100 | 0.987 | 0.988 |
| 111111001 | 11111011 | 0.985 | 0.984 |
| 111111000 | 11111010 | 0.952 | 0.980 |
| 111110111 | 11111010 | 0.981 | 0.980 |
| 111110110 | 11111001 | 0.978 | 0.976 |
| 111110101 | 11111001 | 0.975 | 0.976 |
| 111110100 | 11111000 | 0.973 | 0.973 |
| 111110011 | 11111000 | 0.971 | 0.973 |
| 111110010 | 11110111 | 0.968 | 0.969 |
| 111110001 | 11110110 | 0.965 | 0.965 |
| 111110000 | 11110101 | 0.963 | 0.961 |
| 111101111* | 11110110 | 0.964 | 0.965 |
| 111101110 | 11110101 | 0.961 | 0.961 |
| 111101101 | 11110100 | 0.958 | 0.957 |
| 111101100 | 11110100 | 0.956 | 0.957 |
| 111101011 | 11110011 | 0.953 | 0.953 |
| 111101010 | 11110010 | 0.951 | 0.949 |
| 111101001 | 11110010 | 0.948 | 0.949 |
| 111101000 | 11110001 | 0.945 | 0.945 |
| 111100111 | 11110001 | 0.944 | 0.945 |
| 111100110 | 11110000 | 0.942 | 0.941 |
| 111100101 | 11101111 | 0.939 | 0.937 |
| 111100100 | 11101111 | 0.936 | 0.937 |
| 111100011 | 11101110 | 0.934 | 0.933 |
| 111100010 | 11101110 | 0.932 | 0.933 |
| 111100001 | 11101101 | 0.929 | 0.929 |
| 111100000 | 11101100 | 0.926 | 0.925 |
| 111011111* | 11101101 | 0.931 | 0.929 |
| 111011110* | 11101101 | 0.928 | 0.929 |
| 111011101 | 11101100 | 0.925 | 0.925 |
| 111011100 | 11101011 | 0.923 | 0.922 |
| 111011011 | 11101011 | 0.921 | 0.922 |
| 111011010 | 11101010 | 0.918 | 0.918 |
| 111011001 | 11101001 | 0.915 | 0.914 |
| 111011000 | 11101001 | 0.913 | 0.914 |
| 111010111 | 11101000 | 0.912 | 0.910 |
| 111010110 | 11101000 | 0.909 | 0.910 |
| 111010101 | 11100111 | 0.906 | 0.906 |
| 111010100 | 11100110 | 0.904 | 0.902 |
| 111010011 | 11100110 | 0.901 | 0.902 |
| 111010010 | 11100101 | 0.899 | 0.898 |
| 111010001 | 11100101 | 0.896 | 0.898 |
| 111010000 | 11100100 | 0.893 | 0.894 |
| 111001111* | 11100100 | 0.894 | 0.894 |
| 111001110 | 11100011 | 0.892 | 0.890 |
| 111001101 | 11100011 | 0.889 | 0.890 |
| 111001100 | 11100010 | 0.888 | 0.886 |
| 111001011 | 11100001 | 0.884 | 0.882 |
| 111001010 | 11100001 | 0.881 | 0.882 |
| 111001001 | 11100000 | 0.879 | 0.878 |
| 111001000 | 11011111 | 0.876 | 0.875 |

-continued ratio = 1.900
ADCBITS = 9 OUTBITS = 8
total capacitance = 1 + 2.0 + 3.8 + 7.2 + 13.6 + 25.9 + 49.3 + 93.6 + 177.9 = 374.3 in units of the smallest capacitor
outputvoltagestep = 0.0039

LOOKUP TABLE

| INPUT | OUTPUT | actual voltage | reported voltage |
|---|---|---|---|
| 111000111 | 11011111 | 0.875 | 0.875 |
| 111000110 | 11011110 | 0.872 | 0.871 |
| 111000101 | 11011110 | 0.870 | 0.871 |
| 111000100 | 11011101 | 0.867 | 0.867 |
| 111000011 | 11011101 | 0.865 | 0.867 |
| 111000010 | 11011100 | 0.862 | 0.863 |
| 111000001 | 11011011 | 0.800 | 0.859 |
| 111000000 | 11011011 | 0.857 | 0.859 |
| 110111111* | 11011101 | 0.868 | 0.867 |
| 110111110* | 11011101 | 0.866 | 0.867 |
| 110111101* | 11011100 | 0.863 | 0.863 |
| 110111100* | 11011011 | 0.800 | 0.859 |
| 110111011* | 11011011 | 0.858 | 0.859 |
| 110111010 | 11011010 | 0.856 | 0.855 |
| 110111001 | 11011010 | 0.853 | 0.855 |
| 110111000 | 11011001 | 0.850 | 0.851 |
| 110110111 | 11011001 | 0.849 | 0.851 |
| 110110110 | 11011000 | 0.846 | 0.847 |
| 110110101 | 11010111 | 0.844 | 0.843 |
| 110110100 | 11010111 | 0.841 | 0.843 |
| 110110011 | 11010110 | 0.839 | 0.839 |
| 110110010 | 11010101 | 0.836 | 0.835 |
| 110110001 | 11010101 | 0.834 | 0.835 |
| 110110000 | 11010100 | 0.831 | 0.831 |
| 110101111* | 11010100 | 0.832 | 0.831 |
| 110101110 | 11010011 | 0.829 | 0.827 |
| 110101101 | 11010011 | 0.827 | 0.827 |
| 110101100 | 11010010 | 0.824 | 0.824 |
| 110101011 | 11010010 | 0.822 | 0.824 |
| 110101010 | 11010001 | 0.819 | 0.820 |
| 110101001 | 11010000 | 0.816 | 0.816 |
| 110101000 | 11010000 | 0.814 | 0.818 |
| 110100111 | 11001111 | 0.813 | 0.812 |
| 110100110 | 11001111 | 0.810 | 0.812 |
| 110100101 | 11001110 | 0.807 | 0.808 |
| 110100100 | 11001101 | 0.805 | 0.804 |
| 110100011 | 11001101 | 0.803 | 0.804 |
| 110100010 | 11001100 | 0.800 | 0.800 |
| 110100001 | 11001011 | 0.797 | 0.796 |
| 110100000 | 11001011 | 0.795 | 0.796 |
| 110011111* | 11001100 | 0.799 | 0.800 |
| 110011110* | 11001011 | 0.796 | 0.796 |
| 110011101 | 11001010 | 0.794 | 0.792 |
| 110011100 | 11001010 | 0.791 | 0.792 |
| 110011011 | 11001001 | 0.789 | 0.788 |
| 110011010 | 11001001 | 0.786 | 0.788 |
| 110011001 | 11001000 | 0.784 | 0.784 |
| 110011000 | 11000111 | 0.781 | 0.760 |
| 110010111 | 11000111 | 0.780 | 0.780 |
| 110010110 | 11000110 | 0.777 | 0.776 |
| 110010101 | 11000110 | 0.775 | 0.776 |
| 110010100 | 11000101 | 0.772 | 0.773 |
| 110010011 | 11000100 | 0.770 | 0.769 |
| 110010010 | 11000100 | 0.767 | 0.769 |
| 110010001 | 11000011 | 0.764 | 0.765 |
| 110010000 | 11000010 | 0.762 | 0.761 |
| 110001111* | 11000010 | 0.763 | 0.761 |
| 110001110 | 11000010 | 0.760 | 0.761 |
| 110001101 | 11000001 | 0.757 | 0.757 |
| 110001100 | 11000000 | 0.755 | 0.753 |
| 110001011 | 11000000 | 0.753 | 0.753 |
| 110001010 | 10111111 | 0.750 | 0.749 |
| 110001001 | 10111111 | 0.747 | 0.749 |
| 110001000 | 10111110 | 0.745 | 0.745 |
| 110000111 | 10111110 | 0.743 | 0.745 |
| 110000110 | 10111101 | 0.741 | 0.741 |
| 110000101 | 10111100 | 0.738 | 0.737 |
| 110000100 | 10111100 | 0.735 | 0.737 |
| 110000011 | 10111011 | 0.733 | 0.733 |
| 110000010 | 10111010 | 0.731 | 0.729 |
| 110000001 | 10111010 | 0.728 | 0.729 |
| 110000000 | 10111001 | 0.725 | 0.725 |
| 101111111* | 10111111 | 0.750 | 0.749 |
| 101111110* | 10111111 | 0.747 | 0.749 |
| 101111101* | 10111110 | 0.745 | 0.745 |
| 101111100* | 10111101 | 0.742 | 0.741 |
| 101111011* | 10111101 | 0.740 | 0.741 |
| 101111010* | 10111100 | 0.737 | 0.737 |
| 101111001* | 10111011 | 0.734 | 0.733 |
| 101111000* | 10111011 | 0.732 | 0.733 |
| 101110111* | 10111010 | 0.731 | 0.729 |
| 101110110* | 10111010 | 0.728 | 0.729 |
| 101110010* | 10111001 | 0.725 | 0.725 |
| 101110100 | 10111000 | 0.723 | 0.722 |
| 101110011 | 10111000 | 0.721 | 0.722 |
| 101110010 | 10110111 | 0.718 | 0.718 |
| 101110001 | 10110110 | 0.715 | 0.714 |
| 101110000 | 10110110 | 0.713 | 0.714 |
| 101101111* | 10110110 | 0.713 | 0.714 |
| 101101110 | 10110101 | 0.711 | 0.710 |
| 101101101 | 10110101 | 0.708 | 0.710 |
| 101101100 | 10110100 | 0.705 | 0.706 |
| 101101011 | 10110011 | 0.703 | 0.702 |
| 101101010 | 10110011 | 0.701 | 0.702 |
| 101101001 | 10110010 | 0.696 | 0.698 |
| 101101000 | 10110001 | 0.695 | 0.694 |
| 101100111 | 10110001 | 0.694 | 0.694 |
| 101100110 | 10110000 | 0.692 | 0.690 |
| 101100101 | 10110000 | 0.689 | 0.690 |
| 101100100 | 10101111 | 0.686 | 0.686 |
| 101100011 | 10101110 | 0.684 | 0.682 |
| 101100010 | 10101110 | 0.681 | 0.682 |
| 101100001 | 10101101 | 0.679 | 0.678 |
| 101100000 | 10101100 | 0.676 | 0.675 |
| 101011111* | 10101110 | 0.681 | 0.682 |
| 101011110* | 10101101 | 0.678 | 0.678 |
| 101011101 | 10101100 | 0.675 | 0.675 |
| 101011100 | 10101100 | 0.673 | 0.675 |
| 101011011 | 10101011 | 0.671 | 0.671 |
| 101011010 | 10101010 | 0.668 | 0.667 |
| 101011001 | 10101010 | 0.665 | 0.667 |
| 101011000 | 10101001 | 0.663 | 0.663 |
| 101010111 | 10101001 | 0.661 | 0.663 |
| 101010110 | 10101000 | 0.659 | 0.659 |
| 101010101 | 10100111 | 0.656 | 0.655 |
| 101010100 | 10100111 | 0.653 | 0.655 |
| 101010011 | 10100110 | 0.651 | 0.651 |
| 101010010 | 10100101 | 0.649 | 0.647 |
| 101010001 | 10100101 | 0.646 | 0.647 |
| 101010000 | 10100100 | 0.643 | 0.643 |
| 101001111* | 10100100 | 0.644 | 0.643 |
| 101001110 | 10100100 | 0.641 | 0.643 |
| 101001101 | 10100011 | 0.639 | 0.639 |
| 101001100 | 10100010 | 0.636 | 0.635 |
| 101001011 | 10100010 | 0.634 | 0.635 |
| 101001010 | 10100001 | 0.631 | 0.631 |
| 101001001 | 10100000 | 0.629 | 0.627 |
| 101001000 | 10100000 | 0.626 | 0.627 |
| 101000111 | 10011111 | 0.625 | 0.624 |
| 101000110 | 10011111 | 0.622 | 0.624 |
| 101000101 | 10011110 | 0.620 | 0.620 |
| 101000100 | 10011101 | 0.617 | 0.616 |
| 101000011 | 10011101 | 0.615 | 0.616 |
| 101000010 | 10011100 | 0.612 | 0.612 |
| 101000001 | 10011011 | 0.610 | 0.608 |
| 101000000 | 10011011 | 0.607 | 0.608 |
| 100111111* | 10011110 | 0.618 | 0.620 |
| 100111110* | 10011101 | 0.616 | 0.616 |
| 100111101* | 10011100 | 0.613 | 0.612 |
| 100111100* | 10011100 | 0.610 | 0.612 |

-continued ratio = 1.900
ADCBITS = 9 OUTBITS = 8
total capacitance = 1 + 2.0 + 3.8 + 7.2 + 13.6 + 25.9 + 49.3 + 93.6 + 177.9 = 374.3 in units of the smallest capacitor
outputvoltagestep = 0.0039
LOOKUP TABLE

| INPUT | OUTPUT | actual voltage | reported voltage |
|---|---|---|---|
| 100111011* | 10011011 | 0.608 | 0.608 |
| 100111010 | 10011010 | 0.605 | 0.604 |
| 100111001 | 10011010 | 0.603 | 0.604 |
| 100111000 | 10011001 | 0.600 | 0.600 |
| 100110111 | 10011001 | 0.599 | 0.600 |
| 100110110 | 10011000 | 0.596 | 0.596 |
| 100110101 | 10010111 | 0.594 | 0.592 |
| 100110100 | 10010111 | 0.591 | 0.592 |
| 100110011 | 10010110 | 0.589 | 0.588 |
| 100110010 | 10010110 | 0.585 | 0.568 |
| 100110001 | 10010101 | 0.584 | 0.584 |
| 100110000 | 11110100 | 0.581 | 0.580 |
| 100101111* | 10010100 | 0.582 | 0.580 |
| 100101110 | 10010100 | 0.579 | 0.580 |
| 100101101 | 10010011 | 0.576 | 0.576 |
| 100101100 | 10010010 | 0.574 | 0.573 |
| 100101011 | 10010010 | 0.572 | 0.573 |
| 100101010 | 10010001 | 0.569 | 0.569 |
| 100101001 | 10010000 | 0.566 | 0.565 |
| 100101000 | 10010000 | 0.564 | 0.565 |
| 100100111 | 10001111 | 0.563 | 0.561 |
| 100100110 | 10001111 | 0.560 | 0.561 |
| 100100101 | 10001110 | 0.557 | 0.557 |
| 100100100 | 10001101 | 0.555 | 0.553 |
| 100100011 | 10001101 | 0.552 | 0.553 |
| 100100010 | 10001100 | 0.550 | 0.549 |
| 100100001 | 11001100 | 0.547 | 0.549 |
| 100100000 | 10001011 | 0.545 | 0.545 |
| 100011111* | 10001100 | 0.549 | 0.549 |
| 100011110* | 10001011 | 0.546 | 0.545 |
| 100011101 | 10001011 | 0.544 | 0.545 |
| 100011100 | 10001010 | 0.541 | 0.541 |
| 100011011 | 10001001 | 0.539 | 0.537 |
| 100011010 | 10001001 | 0.536 | 0.537 |
| 100011001 | 10001000 | 0.534 | 0.533 |
| 100011000 | 10000111 | 0.531 | 0.529 |
| 100010111 | 10000111 | 0.530 | 0.529 |
| 100010110 | 10000110 | 0.527 | 0.525 |
| 100010101 | 10000110 | 0.524 | 0.525 |
| 100010100 | 10000101 | 0.522 | 0.522 |
| 100010011 | 10000101 | 0.520 | 0.522 |
| 100010010 | 10000100 | 0.517 | 0.515 |
| 100010001 | 10000011 | 0.514 | 0.514 |
| 100010000 | 10000010 | 0.512 | 0.510 |
| 100001111* | 10000011 | 0.512 | 0.514 |
| 100001110 | 10000010 | 0.510 | 0.510 |
| 100001101 | 10000001 | 0.507 | 0.506 |
| 100001100 | 10000001 | 0.505 | 0.506 |
| 100001011 | 10000000 | 0.502 | 0.502 |
| 100001010 | 01111111 | 0.500 | 0.498 |
| 100001001 | 01111111 | 0.497 | 0.498 |
| 100001000 | 01111110 | 0.494 | 0.494 |
| 100000111 | 01111110 | 0.493 | 0.494 |
| 100000110 | 11111101 | 0.491 | 0.490 |
| 100000101 | 11111100 | 0.488 | 0.486 |
| 100000100 | 01111100 | 0.485 | 0.486 |
| 100000011 | 01111011 | 0.483 | 0.482 |
| 100000010 | 01111011 | 0.481 | 0.482 |
| 100000001 | 01111010 | 0.476 | 0.478 |
| 100000000 | 11111001 | 0.475 | 0.475 |
| 011111111* | 10000110 | 0.525 | 0.525 |
| 011111110* | 10000101 | 0.522 | 0.522 |
| 011111101* | 10000100 | 0.519 | 0.518 |
| 011111100* | 10000100 | 0.517 | 0.518 |
| 011111011* | 10000011 | 0.515 | 0.514 |
| 011111010* | 10000011 | 0.512 | 0.514 |
| 111111111* | 11100010 | 0.509 | 0.510 |
| 011111000* | 11000001 | 0.507 | 0.506 |
| 011110111* | 10000001 | 0.506 | 0.506 |
| 011110110* | 10000000 | 0.503 | 0.502 |
| 011110101* | 10000000 | 0.500 | 0.502 |
| 011110100* | 01111111 | 0.498 | 0.498 |
| 011110011* | 01111110 | 0.495 | 0.494 |
| 011110010* | 01111110 | 0.493 | 0.494 |
| 011110001* | 11111101 | 0.490 | 0.490 |
| 011110000* | 01111100 | 0.488 | 0.486 |
| 011101111* | 01111101 | 0.488 | 0.490 |
| 111101110* | 01111100 | 0.486 | 0.486 |
| 011101101* | 01111011 | 0.483 | 0.482 |
| 011101100* | 01111010 | 0.480 | 0.478 |
| 011101011* | 01111010 | 0.478 | 0.478 |
| 011101010* | 11111001 | 0.476 | 0.475 |
| 011101001 | 01111001 | 0.473 | 0.475 |
| 011101000 | 01111000 | 0.470 | 0.471 |
| 011100111 | 01111000 | 0.469 | 0.471 |
| 011100110 | 01110111 | 0.466 | 0.467 |
| 011100101 | 01110110 | 0.464 | 0.463 |
| 011100100 | 01110110 | 0.461 | 0.463 |
| 011100011 | 01110101 | 0.459 | 0.459 |
| 011100010 | 01110100 | 0.456 | 0.455 |
| 011100001 | 11110100 | 0.454 | 0.455 |
| 011100000 | 01110011 | 0.451 | 0.451 |
| 011011111* | 01110100 | 0.455 | 0.455 |
| 011011110* | 01110011 | 0.453 | 0.451 |
| 011011101 | 01110011 | 0.450 | 0.451 |
| 011011100 | 01110010 | 0.448 | 0.447 |
| 011011011 | 11110010 | 0.445 | 0.447 |
| 011011010 | 01110001 | 0.443 | 0.443 |
| 011011001 | 01110000 | 0.440 | 0.439 |
| 011011000 | 11110000 | 0.437 | 0.439 |
| 011010111 | 01101111 | 0.436 | 0.435 |
| 011010110 | 01101111 | 0.434 | 0.435 |
| 011010101 | 01101110 | 0.431 | 0.431 |
| 011010100 | 01101101 | 0.428 | 0.427 |
| 011010011 | 01101101 | 0.426 | 0.427 |
| 011010010 | 01101100 | 0.424 | 0.424 |
| 011010001 | 01101011 | 0.421 | 0.420 |
| 011010000 | 01101011 | 0.418 | 0.420 |
| 011001111* | 01101011 | 0.419 | 0.420 |
| 011001110 | 01101010 | 0.416 | 0.416 |
| 011001101 | 01101001 | 0.414 | 0.412 |
| 011001100 | 01101001 | 0.411 | 0.412 |
| 011001011 | 01101000 | 0.409 | 0.408 |
| 011001010 | 01101000 | 0.406 | 0.408 |
| 011001001 | 01100111 | 0.404 | 0.404 |
| 011001000 | 01100110 | 0.401 | 0.400 |
| 011000111 | 01100110 | 0.400 | 0.400 |
| 011000110 | 01100101 | 0.397 | 0.396 |
| 011000101 | 01100101 | 0.395 | 0.396 |
| 011000100 | 01100100 | 0.392 | 0.392 |
| 011000011 | 01100011 | 0.390 | 0.388 |
| 011000010 | 01100011 | 0.387 | 0.388 |
| 011000001 | 01100010 | 0.384 | 0.384 |
| 011000000 | 01100001 | 0.382 | 0.380 |
| 010111111* | 01100100 | 0.393 | 0.392 |
| 010111110* | 01100100 | 0.390 | 0.392 |
| 010111101* | 01100011 | 0.388 | 0.388 |
| 010111100* | 01100010 | 0.385 | 0.384 |
| 010111011* | 01100010 | 0.383 | 0.384 |
| 010111010 | 01100001 | 0.380 | 0.380 |
| 010111001 | 01100000 | 0.378 | 0.376 |
| 010111000 | 01100000 | 0.375 | 0.376 |
| 010110111 | 01011111 | 0.374 | 0.373 |
| 010110110 | 01011111 | 0.371 | 0.373 |
| 010110101 | 01011110 | 0.369 | 0.369 |
| 010110100 | 01011101 | 0.366 | 0.365 |
| 010110011 | 01011101 | 0.364 | 0.365 |
| 010110010 | 01011100 | 0.361 | 0.361 |
| 010110001 | 01011011 | 0.359 | 0.357 |
| 010110000 | 01011011 | 0.356 | 0.357 |

-continued ratio = 1.900
ADCBITS = 9 OUTBITS = 8
total capacitance = 1 + 2.0 + 3.8 + 7.2 + 13.6 + 25.9 + 49.3 + 93.6 + 177.9 = 374.3 in units of the smallest capacitor
outputvoltagestep = 0.0039
LOOKUP TABLE

| INPUT | OUTPUT | actual voltage | reported voltage |
|---|---|---|---|
| 010101111* | 01011011 | 0.357 | 0.357 |
| 010101110 | 01011010 | 0.354 | 0.353 |
| 010101101 | 01011010 | 0.351 | 0.353 |
| 010101100 | 01011001 | 0.349 | 0.349 |
| 010101011 | 01011000 | 0.347 | 0.345 |
| 010101010 | 01011000 | 0.344 | 0.345 |
| 010101001 | 01010111 | 0.341 | 0.341 |
| 010101000 | 01010110 | 0.339 | 0.337 |
| 010100111 | 01010110 | 0.337 | 0.337 |
| 010100110 | 01010101 | 0.335 | 0.333 |
| 010100101 | 01010101 | 0.332 | 0.333 |
| 010100100 | 01010100 | 0.329 | 0.329 |
| 010100011 | 01010011 | 0.327 | 0.325 |
| 010100010 | 01010011 | 0.325 | 0.325 |
| 010100001 | 01010010 | 0.322 | 0.322 |
| 010100000 | 01010001 | 0.319 | 0.318 |
| 010011111* | 01010011 | 0.324 | 0.325 |
| 010011110* | 01010010 | 0.321 | 0.322 |
| 010011101 | 01010001 | 0.319 | 0.318 |
| 010011100 | 01010001 | 0.316 | 0.318 |
| 010011011 | 01010000 | 0.314 | 0.314 |
| 010011010 | 01001111 | 0.311 | 0.310 |
| 010011001 | 01001111 | 0.308 | 0.310 |
| 010011000 | 01001110 | 0.306 | 0.306 |
| 010010111 | 01001110 | 0.305 | 0.306 |
| 010010110 | 01001101 | 0.302 | 0.302 |
| 010010101 | 01001100 | 0.299 | 0.298 |
| 010010100 | 01001100 | 0.297 | 0.226 |
| 010010011 | 01001011 | 0.295 | 0.214 |
| 010010010 | 01001010 | 0.292 | 0.290 |
| 010010001 | 01001010 | 0.289 | 0.290 |
| 010010000 | 01001001 | 0.287 | 0.286 |
| 010001111* | 01001001 | 0.287 | 0.286 |
| 010001110 | 01001001 | 0.285 | 0.266 |
| 010001101 | 01001000 | 0.262 | 0.282 |
| 010001100 | 01000111 | 0.279 | 0.278 |
| 010001011 | 01000111 | 0.277 | 0.278 |
| 010001010 | 01000110 | 0.275 | 0.275 |
| 010001001 | 01000101 | 0.272 | 0.271 |
| 010001000 | 01000101 | 0.269 | 0.271 |
| 010000111 | 01000100 | 0.268 | 0.267 |
| 010000110 | 01000100 | 0.266 | 0.267 |
| 010000101 | 01000011 | 0.263 | 0.263 |
| 010000100 | 01000010 | 0.260 | 0.259 |
| 010000011 | 01000010 | 0.258 | 0.259 |
| 010000010 | 01000001 | 0.255 | 0.255 |
| 010000001 | 01000000 | 0.253 | 0.251 |
| 010000000 | 01000000 | 0.250 | 0.251 |
| 001111111* | 01000110 | 0.275 | 0.275 |
| 001111110* | 01000101 | 0.272 | 0.271 |
| 001111101* | 01000101 | 0.269 | 0.271 |
| 001111100* | 01000100 | 0.267 | 0.267 |
| 001111011* | 01000011 | 0.265 | 0.263 |
| 001111010* | 01000011 | 0.262 | 0.263 |
| 001111001* | 01000010 | 0.259 | 0.259 |
| 001111000* | 01000001 | 0.257 | 0.255 |
| 001110111* | 01000001 | 0.255 | 0.255 |
| 001110110* | 01000000 | 0.253 | 0.251 |
| 001110101* | 01000000 | 0.250 | 0.251 |
| 001110100 | 00111111 | 0.247 | 0.247 |
| 001110011 | 00111111 | 0.245 | 0.247 |
| 001110010 | 00111110 | 0.243 | 0.243 |
| 001110001 | 00111101 | 0.240 | 0.239 |
| 001110000 | 00111101 | 0.237 | 0.239 |
| 001101111* | 00111101 | 0.238 | 0.239 |
| 001101110 | 00111100 | 0.236 | 0.235 |
| 001101101 | 00111011 | 0.233 | 0.231 |
| 001101100 | 00111011 | 0.230 | 0.231 |
| 001101011 | 00111010 | 0.228 | 0.227 |
| 001101010 | 00111001 | 0.225 | 0.224 |

-continued ratio = 1.900
ADCBITS = 9 OUTBITS = 8
total capacitance = 1 + 2.0 + 3.8 + 7.2 + 13.6 + 25.9 + 49.3 + 93.6 + 177.9 = 374.3 in units of the smallest capacitor
outputvoltagestep = 0.0039
LOOKUP TABLE

| INPUT | OUTPUT | actual voltage | reported voltage |
|---|---|---|---|
| 001101001 | 00111001 | 0.223 | 0.224 |
| 001101000 | 00111000 | 0.220 | 0.220 |
| 001100111 | 00111000 | 0.219 | 0.220 |
| 001100110 | 00110111 | 0.216 | 0.216 |
| 001100101 | 00110110 | 0.214 | 0.212 |
| 001100100 | 00110110 | 0.211 | 0.212 |
| 001100011 | 00110101 | 0.209 | 0.208 |
| 001100010 | 00110101 | 0.206 | 0.208 |
| 001100001 | 00110100 | 0.204 | 0.204 |
| 001100000 | 00110011 | 0.201 | 0.200 |
| 001011111* | 00110100 | 0.205 | 0.204 |
| 001011110* | 00110100 | 0.203 | 0.204 |
| 001011101 | 00110011 | 0.200 | 0.200 |
| 001011100 | 00110010 | 0.197 | 0.196 |
| 001011011 | 00110010 | 0.195 | 0.196 |
| 001011010 | 00110001 | 0.193 | 0.192 |
| 001011001 | 00110000 | 0.190 | 0.188 |
| 001011000 | 00110000 | 0.187 | 0.188 |
| 001010111 | 00101111 | 0.166 | 0.184 |
| 001010110 | 00101111 | 0.184 | 0.184 |
| 001010101 | 00101110 | 0.181 | 0.180 |
| 001010100 | 00101101 | 0.178 | 0.176 |
| 001010011 | 00101101 | 0.176 | 0.176 |
| 001010010 | 00101100 | 0.173 | 0.173 |
| 001010001 | 00101100 | 0.171 | 0.173 |
| 001010000 | 00101011 | 0.168 | 0.169 |
| 001001111* | 00101011 | 0.189 | 0.169 |
| 001001110 | 00101010 | 0.166 | 0.165 |
| 001001101 | 00101010 | 0.164 | 0.165 |
| 001001100 | 00101001 | 0.161 | 0.161 |
| 001001011 | 00101010 | 0.159 | 0.157 |
| 001001010 | 00101000 | 0.156 | 0.157 |
| 001001001 | 00100111 | 0.154 | 0.153 |
| 001001000 | 00100110 | 0.151 | 0.149 |
| 001000111 | 00100110 | 0.150 | 0.149 |
| 001000110 | 00100101 | 0.147 | 0.145 |
| 001000101 | 00100101 | 0.144 | 0.145 |
| 001000100 | 00100100 | 0.142 | 0.141 |
| 001000011 | 00100100 | 0.140 | 0.141 |
| 001000010 | 00100011 | 0.137 | 0.137 |
| 001000001 | 00100010 | 0.134 | 0.133 |
| 001000000 | 00100010 | 0.132 | 0.133 |
| 000111111* | 00100100 | 0.143 | 0.141 |
| 000111110* | 00100100 | 0.140 | 0.141 |
| 000111101* | 00100011 | 0.138 | 0.137 |
| 000111100* | 00100010 | 0.135 | 0133 |
| 000111011* | 00100010 | 0.133 | 0.133 |
| 000111010 | 00100001 | 0.130 | 0.129 |
| 000111001 | 00100001 | 0.128 | 0.129 |
| 000111000 | 00100000 | 0.125 | 0.125 |
| 000110111 | 00100000 | 0.124 | 0.125 |
| 000110110 | 00011111 | 0.121 | 0.122 |
| 000110101 | 00011110 | 0.119 | 0.118 |
| 000110100 | 00011110 | 0.116 | 0.118 |
| 000110011 | 00011101 | 0.114 | 0.114 |
| 000110010 | 00011100 | 0.111 | 0.110 |
| 000110001 | 00011100 | 0.108 | 0.110 |
| 000110000 | 00011011 | 0.106 | 0.106 |
| 000101111* | 00011011 | 0.107 | 0.106 |
| 000101110 | 00011010 | 0.104 | 0.102 |
| 000101101 | 00011010 | 0.101 | 0.102 |
| 000101100 | 00011001 | 0.099 | 0.098 |
| 000101011 | 00011001 | 0.096 | 0.098 |
| 000101010 | 00011000 | 0.094 | 0.094 |
| 000101001 | 00010111 | 0.091 | 0.090 |
| 000101000 | 00010111 | 0.088 | 0.090 |
| 000100111 | 00010110 | 0.087 | 0.086 |
| 000100110 | 00010110 | 0.085 | 0.086 |
| 000100101 | 00010101 | 0.082 | 0.082 |
| 000100100 | 00010100 | 0.079 | 0.078 |

-continued ratio = 1.900
ADCBITS = 9 OUTBITS = 8
total capacitance = 1 + 2.0 + 3.8 + 7.2 + 13.6 + 25.9 + 49.3 + 93.6 +
177.9 = 374.3 in units of the smallest capacitor
outputvoltagestep = 0.0039

LOOKUP TABLE

| INPUT | OUTPUT | actual voltage | reported voltage |
|---|---|---|---|
| 000100011 | 00010100 | 0.077 | 0.078 |
| 000100010 | 00010011 | 0.075 | 0.075 |
| 000100001 | 00010010 | 0.072 | 0.071 |
| 000100000 | 00010010 | 0.069 | 0.071 |
| 000011111* | 00010011 | 0.074 | 0.075 |
| 000011110* | 00010010 | 0.071 | 0.071 |
| 000011101 | 00010001 | 0.068 | 0.067 |
| 000011100 | 00010001 | 0.066 | 0.067 |
| 000011011 | 00010000 | 0.064 | 0.063 |
| 000011010 | 00010000 | 0.061 | 0.063 |
| 000011001 | 00001111 | 0.058 | 0.059 |
| 000011000 | 00001110 | 0.056 | 0.055 |
| 000010111 | 00001110 | 0.055 | 0.055 |
| 000010110 | 00001101 | 0.052 | 0.051 |
| 000010101 | 00001101 | 0.049 | 0.051 |
| 000010100 | 00001100 | 0.047 | 0.047 |
| 000010011 | 00001011 | 0.044 | 0.043 |
| 000010010 | 00001011 | 0.042 | 0.043 |
| 000010001 | 00001010 | 0.039 | 0.039 |
| 000010000 | 00001001 | 0.036 | 0.035 |
| 000001111* | 00001010 | 0.037 | 0.039 |
| 000001110 | 00001001 | 0.035 | 0.035 |
| 000001101 | 00001000 | 0.032 | 0.031 |
| 000001100 | 00000111 | 0.029 | 0.027 |
| 000001011 | 00000111 | 0.027 | 0.027 |
| 000001010 | 00000110 | 0.025 | 0.024 |
| 000001001 | 00000110 | 0.022 | 0.024 |
| 000001000 | 00000101 | 0.019 | 0.020 |
| 000000111 | 00000101 | 0.018 | 0.020 |
| 000000110 | 00000100 | 0.015 | 0.016 |
| 000000101 | 00000011 | 0.013 | 0.012 |
| 000000100 | 00000011 | 0.010 | 0.012 |
| 000000011 | 00000010 | 0.008 | 0.005 |
| 000000010 | 00000001 | 0.005 | 0.004 |
| 000000001 | 00000001 | 0.003 | 0.004 |
| 000000000 | 00000000 | 0.000 | 0.000 |

*denotes input codes that will never appear
uniquecodes = 417

Although only a preferred mode has been described above, it should be understood that modifications are possible without separating from the preferred teachings.

One important modification is to use this system in a D/A converter, preferably one which uses capacitors for its operation. Hence, this system is usable with any device which converts between analog and digital.

More generally, this system is usable along with any device that has a differential non-linearity error.

All such modifications are intended to be encompassed within the following claims.

What is claimed is:

1. A corrected A to D converter, comprising:
    an A to D converter unit, receiving an analog signal and producing an uncorrected digital output signal that is indicative of the analog signal; and
    a memory, storing a relationship between said uncorrected digital output and a corrected digital output as corrected to compensate for differential non linearity errors, said memory connected to receive information indicating said uncorrected digital output signal, and to output said corrected digital output which corresponds to said uncorrected digital output wherein said uncorrected digital output has more bits than said corrected digital output.

2. A method of correcting for an inaccuracy in a converter circuit, comprising:
    determining information about inaccuracy in an uncorrected A to D circuit;
    using said uncorrected A to D converter circuit to produce more resolution than that necessary for desired output, to produced an uncorrected, extra resolution output;
    using said information determined by said determining to determine a correlation between said uncorrected extra resolution output, and a correlated final output;
    programming a look up table using said correlation; and
    using said uncorrected extra resolution output to obtain corrected information from the look up table.

3. A method as in claim 2 wherein said inaccuracy is a differential nonlinearity.

4. A method as in claim 2 wherein said inaccuracy is fixed pattern noise.

5. A method as in claim 3 wherein said uncorrected extra resolution digital information is used as a physical address for the look up table.

6. A method as in claim 2 further comprising determining specific values of said uncorrected extra resolution information which will never exist during said determining, and not storing values indicative of said extra resolution information in said look up table, to conserve space in said look up table.

7. A method as in claim 2 further comprising providing a second A to D converter which has similar characteristics to the first A to D converter; and
    using said correction from said look up table for both of said first and second A to D converters.

8. An A to D conversion correction circuit, comprising:
    an A to D converter, producing an uncorrected digital output, wherein said A to D converters produce more resolution than is necessary for a desired output, and said look up table output has less resolution than a resolution of said output of said A to D converters;
    a look up table, storing a correlation between said uncorrected digital output, and a corrected digital output, said corrected digital output including at least correction from a differential nonlinearity in the A to D converter, said look up table arranged such that said correction values are stored at addresses of said uncorrected values such that said uncorrected values form the address for reading the corrected values out of the look up table.

9. A system as in claim 8 further comprising an additional A to D converter, also associated with the same look up table, and having similar characteristics to those of the first A to D converter, both said first and second A to D converters being corrected by the same said look up table.

10. An A to D converter system, comprising:
    a first A to D converter having first characteristics;
    a second A to D converter, also having said first characteristics; and
    a look up table, having stored therein information to compensate for said first characteristics, said information compensating at least for a differential nonlinearity error in said first and second A to D converters, and said look up table being addressed using uncorrected digital information from each of said first and second A to D converters to produce corrected digital information from each of said first and second A to D converters wherein said first and second A to D converters and said look up table are all formed on a common substrate wherein each of said first and second A to D converters have more resolution than is produced by an output of said look up table.

11. A method as in claim 10 wherein said look up table also compensates for fixed pattern noise in an image circuit.

12. A method of analog to digital converting an output, comprising:

using an analog to digital converter device, which has a dc controlled differential nonlinearity, to convert an analog value to a digital uncorrected value;

testing characteristics of the digital uncorrected value, determining codes in said digital output value which will never occur;

writing only those codes which will occur into a look up table, and not writing the codes which will not occur into said look up table; and using said look up table to correct for the differential nonlinearity.

13. A method of correcting for an inaccuracy in a circuit that converts between analog and digital, comprising:

determining information about differential non-linearities in an uncorrected circuit of a type that converts between a first signal and a second signal, where one of said first and second signals is analog, and the other of said first and second signals is digital;

using said uncorrected converter circuit to produce more resolution than that necessary for a desired output, to produce an uncorrected, extra resolution output;

using said information determined by said determining to determine a correlation between said uncorrected extra resolution output, and a corrected final output;

programming a look up table using said correlation; and using said uncorrected extra resolution output to obtain corrected information from the look up table.

14. A method as in claim 2 wherein said inaccuracy also includes fixed pattern noise.

15. A corrected A to D converter, comprising:

an A to D converter unit, receiving an analog signal and dc producing an uncorrected digital output signal that is indicative of the analog signal, said A to D converter including capacitors to effect the A to D conversion, sizes of said capacitors being constrained to produce an intentional controlled differential nonlinearity, where at least a plurality of said capacitors are less than double the size of the next-smallest capacitor; and a memory, storing a relationship between said uncorrected digital output and a corrected digital output as corrected to compensate for differential non linearity errors, and wherein wherein said uncorrected digital output has more bits than said corrected digital output, said memory connected to receive information indicating said uncorrected digital output signal as a physical address which addresses the corrected digital output, and to output said corrected digital output which corresponds to said uncorrected digital output, said memory not storing all values of uncorrected digital output, specific values of said uncorrected digital output which will never occur not being stored, to conserve space in said look up table.

16. A system as in claim 15 wherein said inaccuracy also includes fixed pattern noise.

17. A system as in claim 15 further comprising providing a second A to D converter which has similar characteristics to the first A to D converter; and using said correction from said memory for both of said first and second A to D converters.

18. A system as in claim 17 wherein said first and second A to D converters and said look up table are all formed on a common substrate.

19. A system as in claim 15 wherein said memory also compensates for fixed pattern noise in an image circuit.

20. A system as in claim 15, wherein at least a plurality of said capacitors are sized as $(2 - correction) \ddot{y} 2^N \ddot{y} n$, where correction is the correction value, N is the bit number −1, and n is the value of the smallest capacitor.

* * * * *

UNITED STATES PATENT AND TRADEMARK OFFICE
CERTIFICATE OF CORRECTION

PATENT NO. : 6,191,714 B1
DATED : February 20, 2001
INVENTOR(S) : Harry Langenbacher It is certified that error appears in the above-identified patent and that said Letters Patent is hereby corrected as shown below:

Column 12,
Line 7, please replace "produced" with -- produce --.
Line 40, please replace "from" with -- for --.

Column 13,
Line 7, please delete the last word "do".
Line 10, please replace "," with -- ; --.
Line 38, please delete the first word "do".

Column 14,
Line 10, please delete the first word "wherein".

Signed and Sealed this

Twenty-third Day of April, 2002

Attest:

Attesting Officer

JAMES E. ROGAN
*Director of the United States Patent and Trademark Office*